(12) United States Patent  (10) Patent No.: US 8,269,219 B2
Street  (45) Date of Patent: Sep. 18, 2012

(54) PRINTED TFT AND TFT ARRAY WITH SELF-ALIGNED GATE

(75) Inventor: Robert A. Street, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 13/280,407

(22) Filed: Oct. 25, 2011

(65) Prior Publication Data

US 2012/0037992 A1 Feb. 16, 2012

Related U.S. Application Data

(62) Division of application No. 11/959,956, filed on Dec. 19, 2007, now Pat. No. 8,110,450.

(51) Int. Cl.
H01L 29/786 (2006.01)
(52) U.S. Cl. .................. 257/43; 257/E21.409
(58) Field of Classification Search .................. 257/43, 257/E21.409
See application file for complete search history.

(56) References Cited

U.S. PATENT DOCUMENTS

| | | | |
|---|---|---|---|
| 5,243,206 A | 9/1993 | Zhu et al. |
| 5,414,283 A | 5/1995 | de Boer et al. |
| 5,536,932 A | 7/1996 | Hack et al. |
| 5,717,223 A | 2/1998 | Hack et al. |
| 5,736,435 A | 4/1998 | Venkatesan et al. |
| 5,989,944 A | 11/1999 | Yoon |
| 6,011,531 A | 1/2000 | Mei et al. |
| 6,107,641 A | 8/2000 | Mei et al. |
| 6,137,151 A | 10/2000 | Street |
| 6,245,602 B1 | 6/2001 | Ho et al. |
| 6,521,489 B2 | 2/2003 | Duthaler et al. |
| 6,835,986 B2 | 12/2004 | Nakajima et al. |
| 6,972,261 B2 | 12/2005 | Wong et al. |
| 7,270,694 B2 | 9/2007 | Li et al. |
| 7,468,304 B2 | 12/2008 | Kaji et al. |
| 7,476,572 B2 | 1/2009 | Morisue et al. |
| 7,494,923 B2 | 2/2009 | Yamamoto et al. |
| 2006/0160251 A1 | 7/2006 | Dyreklev et al. |
| 2006/0211187 A1 | 9/2006 | Choi et al. |
| 2007/0272922 A1 | 11/2007 | Kim et al. |

FOREIGN PATENT DOCUMENTS

| | | |
|---|---|---|
| WO | 0059027 A1 | 10/2000 |
| WO | 2005071478 A1 | 8/2005 |
| WO | 2006094231 A1 | 9/2006 |
| WO | 2008144759 A2 | 11/2008 |

OTHER PUBLICATIONS

EP Search Report, Appl. No. EP08171500, Mailed Mar. 11, 2011 (Completed Mar. 4, 2011).
Street, Robert A. et al., "Jet Printing Flexible Displays", Materials Today, vol. 9, Issue 4, Apr. 2006, pp. 32, 37.

(Continued)

Primary Examiner — Colleen Matthews
(74) Attorney, Agent, or Firm — Fay Sharpe LLP

(57) ABSTRACT

A method is used to form a self-aligning thin film transistor. The thin film transistor includes a gate contact formed with a state-switchable material, and a dielectric layer to isolate the gate contact. A source-drain layer, which includes a source contact, and a drain contact are formed with a source-drain material. An area of the gate contact is exposed to a form of energy, wherein the energy transforms a portion of the state switchable material from a non-conductive material to a conductive material, the conductive portion defining the gate contact. A semiconductor material is formed between the source contact and the drain contact.

19 Claims, 7 Drawing Sheets

OTHER PUBLICATIONS

Arias, Ana C. et al. "All Additive Ink-Jet Printed Display Backplanes: Materials, Development and Integration", Journal of SID, 15/7, Jul. 15, 2007, pp. 485-489.

Sirringhaus, H. et al., "High Resolution Inkjet Printing of All-Polymer Transistor Circuits", Science, vol. 290, Dec. 2000, pp. 2123-2126.

Kim, E. et al. "Photo-induced Electrical Switching Through a Mainchain Polymer," J. Mater. Chem., vol. 16, 2006, pp. 1384-1389.

Guo, X., et al. "Reversible Photoregulation of the Electrical Conductivity of Spiropyran-Doped Polyaniline for Information Recording and Nondestructive Processing", Advanced Materials, vol. 16, Issue 7, 2004, pp. 636-640.

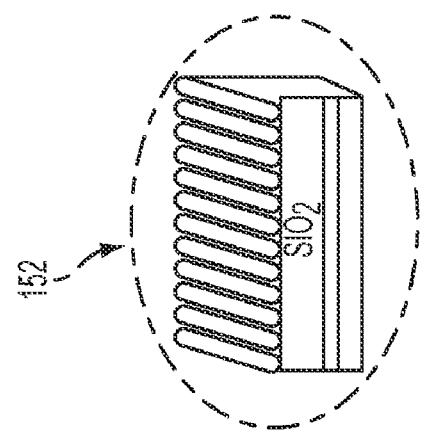
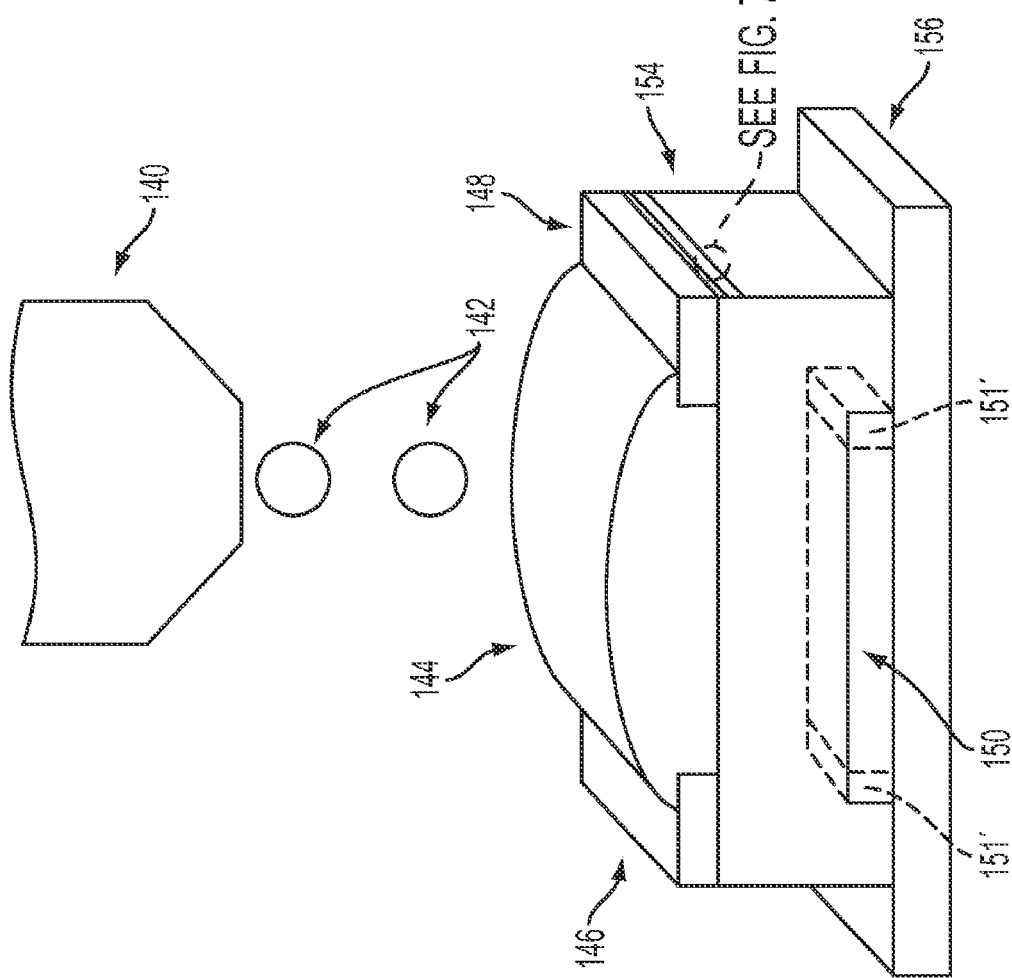

PRINTED TFT AND TFT ARRAY WITH SELF-ALIGNED GATE

This application claims the priority, as a divisional, of U.S. application Ser. No. 11/959,956, filed Dec. 19, 2007, the disclosure of which is incorporated herein by reference in its entirety.

STATEMENT REGARDING FEDERALLY SPONSORED RESEARCH OR DEVELOPMENT

This invention was made with United States Government support under Cooperative Agreement No. 70NANB7H3007 awarded by the National Institute of Standards and Technology (NIST). The United States Government has certain rights in the invention.

BACKGROUND

The present application relates to thin film structures and processes for making the same. More particularly, the present concepts relate to a thin film transistor where the source and drain contacts are formed so as not to overlap the transistor gate, thereby reducing or eliminating parasitic capacitance and feed-through voltage.

Aspects of the present application may be useful to the manufacture of thin film transistors with lowered parasitic capacitance between the drain and source contacts and the gate contact, and more particularly to the manufacture of such TFTs using additive printing processes. Such TFTs may be used in electronic devices and/or components such as but not limited to low cost display backplanes.

Additive printing, additive processing or other similar terminology refers to processes in which materials are arranged and formed into electronic components without subsequent material removal steps. This is in contrast to typical semiconductor fabrication methods which require deposition of material followed by selected removal of portions of the material using techniques such as photolithography, chemical and/or vapor etching, or other subtractive manufacturing techniques.

Additive printing of active materials is considered a desirable process to fabricate devices, since it is cost effective, where each material is deposited where it needs to be in a single process step, and the only wasted material is the solvent.

Among the issues in TFT manufacturing, for both additive and subtractive processing, is the need reduce or eliminate TFT parasitic capacitance, which arises from the overlap of the source and drain contacts with the gate contact. The existence of this parasitic capacitance results in a variety of negative issues, including not allowing electronic displays to operate at high refresh rates.

A number of proposals to provide TFT self-alignment to remove overlap between the source-drain contacts and the gate contact have been proposed in connection with manufacturing of TFTs using subtractive manufacturing processes. For example, U.S. Pat. No. 6,017,641, entitled "Thin Film Transistor With Reduced Parasitic Capacitance and Reduced Feedthrough Voltage," to Mei et al., issued Aug. 22, 2000; and U.S. Pat. No. 5,717,223, entitled "Array With Amorphous Silicon TFTs In Which Channel Leads Overlap Insulating Region No More Than Maximum Overlap," to Hack et al., issued Feb. 10, 1998, among others.

While there is an issue of parasitic capacitance in connection with TFTs designed using subtractive processing techniques, it is a particular issue with additive printing processing techniques. This is true since additive printing is not able to register layers to the precision that is possible with lithography, as used in the subtractive domain. Thus it is necessary in additive printing to provide a relatively large contact overlap, which in turn increases TFT parasitic capacitance.

BRIEF DESCRIPTION

A method is used to form a self-aligning thin film transistor. The thin film transistor includes a gate contact formed with a state-switchable material, and a dielectric layer to isolate the gate contact. A source-drain layer, which includes a source contact, and a drain contact are formed with a source-drain material. An area of the gate contact is exposed to a form of energy, wherein the energy transforms a portion of the state switchable material from a non-conductive material to a conductive material, the conductive portion defining the gate contact. A semiconductor material is formed between the source contact and the drain contact.

BRIEF DESCRIPTION OF THE DRAWINGS

FIG. 7 illustrates an ongoing process for constructing a TFT using additive printing methods which may be used in the present application; AND FIG. 7A is an expanded view of a portion of FIG. 7.

DETAILED DESCRIPTION

Additive printing is a promising technology for patterning and forming electronic devices as it requires no physical mass, and has digital control of ejection. It also has the potential to reduce manufacturing costs and enable roll-to-roll processing. This type of processing may be implemented by a number of existing printing technologies including jet printing systems, piezoelectric printing systems, acoustic printing systems, as well as offset, gravure and flexography, among others.

An area of considerable interest for additive printing is in manufacturing low-cost TFTs. One approach is to use additive printing for most or all of the layers that make up the TFT.

However, as previously mentioned, an issue which arises in connection with TFTs in general, but is particularly problematic with printed TFTs and TFT arrays is parasitic capacitance, and the desire to have non or very low parasitic capacitance.

In one instance parasitic capacitance arises due to the overlap of the source and drain contacts with the gate contact. Printing techniques have a much poorer ability to register layers than is possible with photolithography, and so the overlap has to be made correspondingly larger in printing operations.

Figure 1:
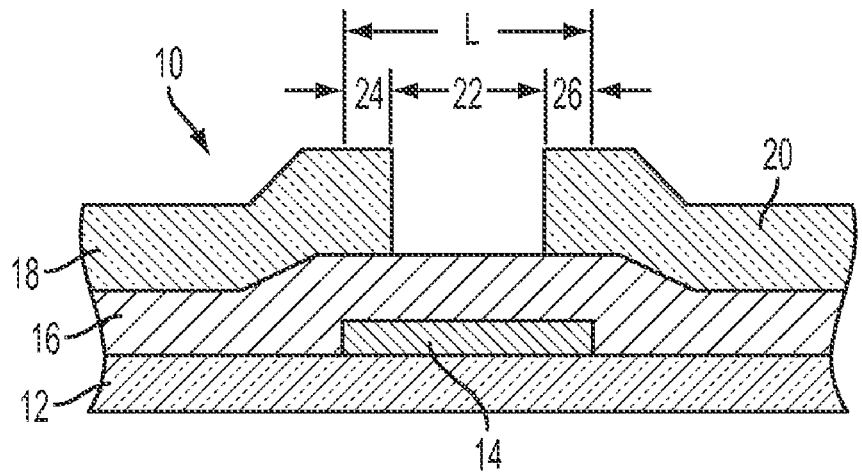
FIG. 1 shows an existing bottom gate TFT having an overlap between the gate contact and the contacts of the drain and source.
Figure 2:
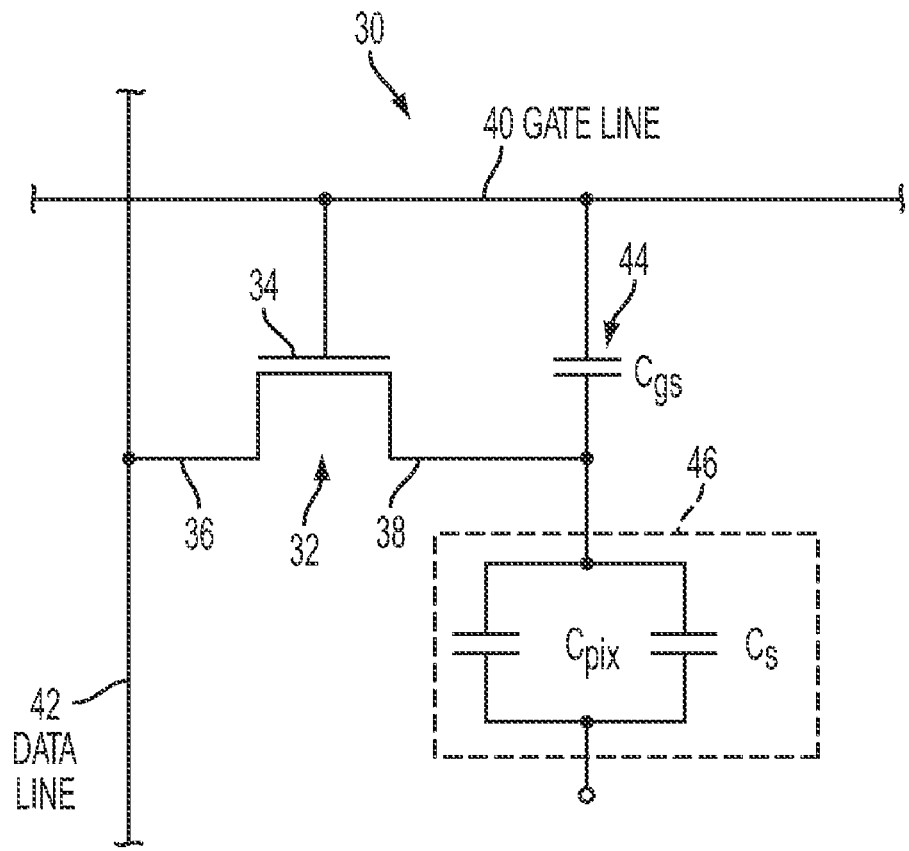
FIG. 2 is a schematic showing parasitic capacitance within a TFT.

The concept of parasitic capacitance caused by overlapping of source and drain contacts with a gate contact is illustrated by FIGS. 1 and 2, where FIG. 1 depicts a typical bottom-gate transistor structure in which a thin film transistor (TFT) 10 is built on a substrate 12, which includes gate contact 14 formed on substrate 12, gate dielectric layer 16, drain contact 18 and source contact 20, with a channel 22 between drain contact 18 and source contact 20. Due to imprecision in existing manufacturing processes, overlap regions 24 and 26, of the source-drain contacts exist.

The FIG. 2 provides a schematic illustration of parasitic capacitance. A cell 30 for either display or sensing is provided with TFT 32, which acts as a switch for addressing the cell. Gate 34 of TFT 32 is connected to gate line 40, and drain 36 of TFT 32 is connected to data line 42. Source 38 of TFT 32 is connected to either a sensor device (such as a p-i-n photodetector, not shown) or a display device (such as a liquid crystal layer structure, not shown), each generally referred to herein as pixel 46.

The overlaps 24 and 26 of FIG. 1 are responsible for parasitic capacitance between the source and gate, illustrated by capacitor 44. This parasitic capacitance results in feedthrough voltage on the pixel electrode, and depending on the display type may cause poor image quality, including image flicker (inaccuracy in the OFF-to-ON transition) and sticking (inaccuracy in the ON-to-OFF transition). In the case of a sensor device, parasitic capacitance results in readout noise. Also, since the overlap may vary from cell to cell across the array (for example, due to variations in the substrate, resolution of the lithography, etc.) the feed-through voltage may similarly vary from cell to cell.

The problem of the parasitic capacitance relates to the feedthrough voltage. The backplane is operated by turning on the TFT by applying a gate voltage. A data voltage is applied to the data lines and this voltage is passed thorough to the pixel. When the gate voltage is turned off, the parasitic capacitance reduces the voltage on the pixel by a proportion given approximately by the ratio, $F_P$, of the parasitic capacitance to the pixel capacitance, $C_{PIX}$.

$$F_P = C_{PR}/C_{PIX}$$

Hence, if a data voltage of 30V is applied and the ratio $F_P$ is 0.1, then the voltage drop is about 3V, which is small enough to be consistent with display operation. Hence, for a given amount of parasitic capacitance, the way to control the feedthrough voltage is to increase the pixel capacitance until the ratio $F_P$ is small enough.

Unfortunately increasing the pixel capacitance slows down the charging of the pixel. The time required to charge the pixel is, $$T_{CH} = N \cdot R \cdot C_{PIX}$$

where R is the resistance of the TFT when it is switched on, and N is a number typically 3-5. Hence the solution to the feedthrough voltage problem can make the switching time too long. The problem is particularly bad for printed transistors which use organic materials for the transistor, because the mobility of the TFT is often small, which increases the TFT resistance and further increases the switching time.

Several possible solutions have been proposed to the problem of TFT parasitic capacitance.

1. The use of photolithography avoids the problem by having good layer to layer registration, but this is an expensive process and the point of using printing techniques is to lower the manufacture cost relative to photolithography.
2. The use of a high mobility TFT semiconductor, reduces R and the charging time. However suitable printable high mobility materials have not been found.
3. If the source-drain spacing (the channel length) in the TFT can be reduced, then R decreases and the problem is reduced. This approach has been implemented by patterning a small channel length in a process in which the remaining steps are done by printing. This process helps, but at the expense of a more complicated patterning step, and a significant parasitic capacitance still exists.

Therefore, an alternative manner to diminish or eliminate parasitic capacitance would be beneficial. Turning now to one embodiment of the present application parasitic capacitance is eliminated by fabricating a TFT with a self-aligning gate contact. The proposed structure, applied to a bottom gate TFT, is illustrated by FIGS. 3A-3E.

Figure 3A:
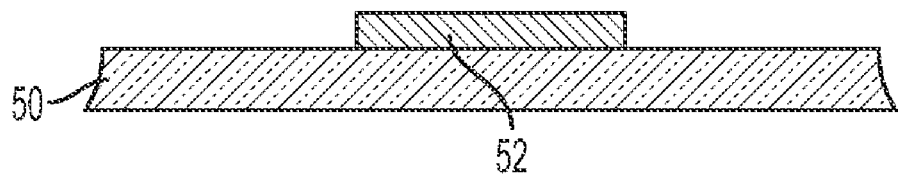
FIGS. 3A-3E show the processing steps to configure a self-aligning bottom gate TFT according to the concepts of the present application.

FIG. 3A depicts a substrate 50, having a gate contact area formed with a state-switchable gate contact material 52, in the vicinity where a TFT gate contact will be formed. This state-switchable gate contact material 52 is, in one embodiment, a printed layer of photo-switchable material or temperature-switchable material and should be non-conductive after printing and/or depositing.

Figure 3B:
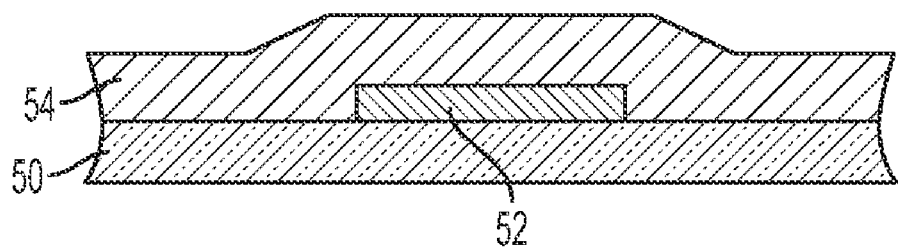

Next, FIG. 3B illustrates a gate dielectric 54 made from either a polymer solution, by PECVD deposition, or another convenient technique formed over state-switchable contact material 52 and substrate 50. For state-switching processes where the material is a photo-switchable material gate dielectric 54 will be transparent.

Figure 3C:
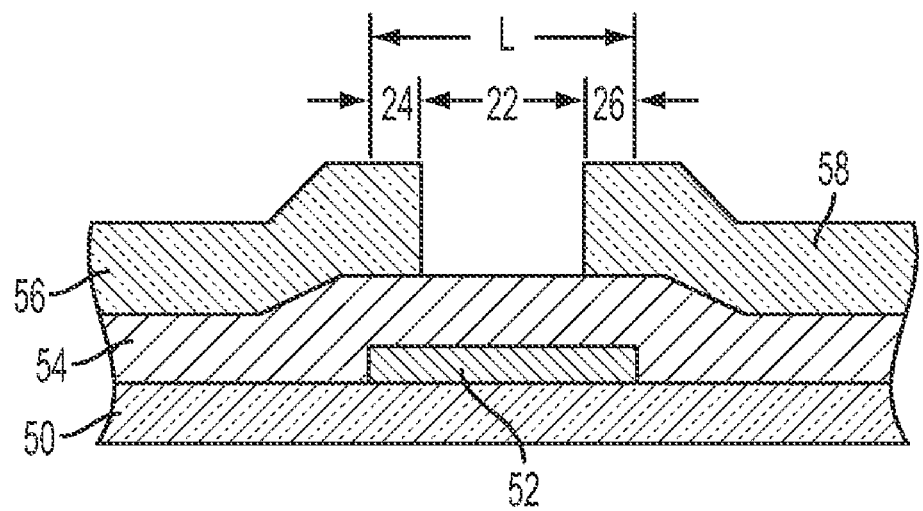

Thereafter, as depicted in FIG. 3C, drain contact 56 and source contact 58 are formed on top of dielectric layer 54. The drain contact 56 and source contact 58 can each be printed using, for example, a nano-particle metal solution, a different type of metal, or other appropriate material. Drain contact 56 and source contact 58 form a mask for the self-aligning process according to one of the embodiments of the present application.

Figure 3D:
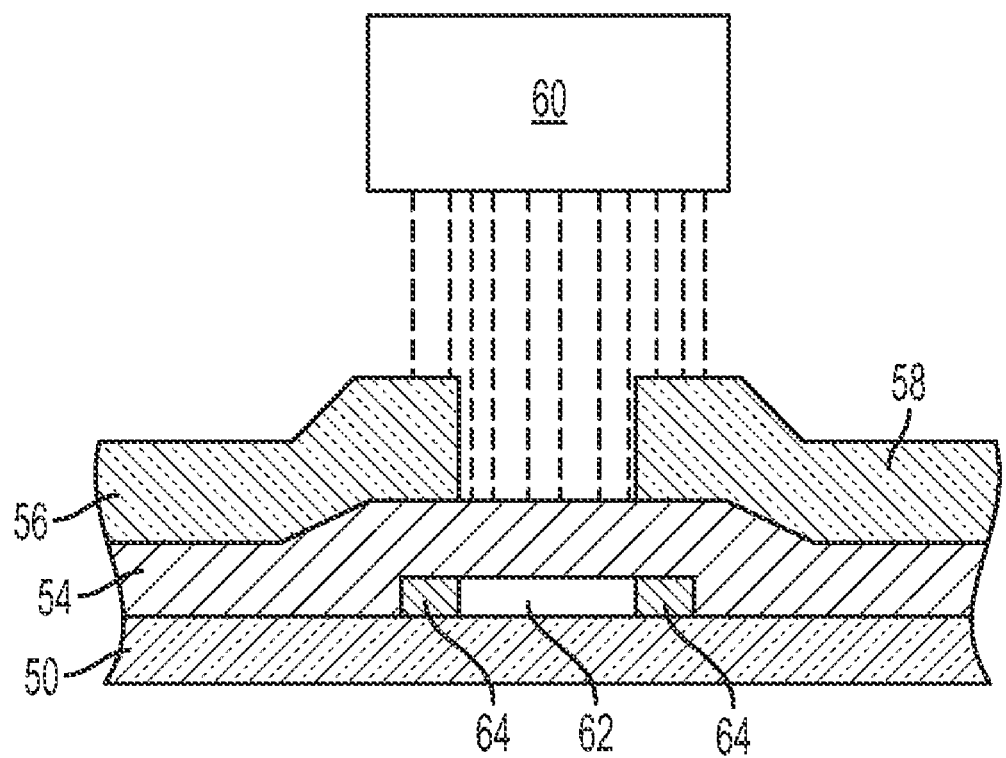

The next step, illustrated in FIG. 3D, is to expose gate contact state-switchable material 52, to a form of energy generated by a device such as energy source 60, causing material 52 to become conductive where exposed. More particularly the portion of state-switchable material 52 which has been exposed will turn conductive 62, while the portions of the state-switchable material that has not been exposed will remain non-conductive 64. As can be seen in FIG. 3D, by use of this operation, the overlap between the drain contact 56, source contact 58 and gate contact 52 is eliminated.

In the present embodiment the energy source 60 may be a light source which illuminates the state-switchable material from above so that the space between the source contact and drain contact is exposed and the material switches to a conductive state, and where the region under the opaque source and drain contacts is unexposed and remains an insulator. However, it is to be appreciated that other forms of energy may be used. In addition different spectrums of light may be used including visible light, ultraviolet and infra-red, x-rays and microwaves, among others.

Figure 3E:
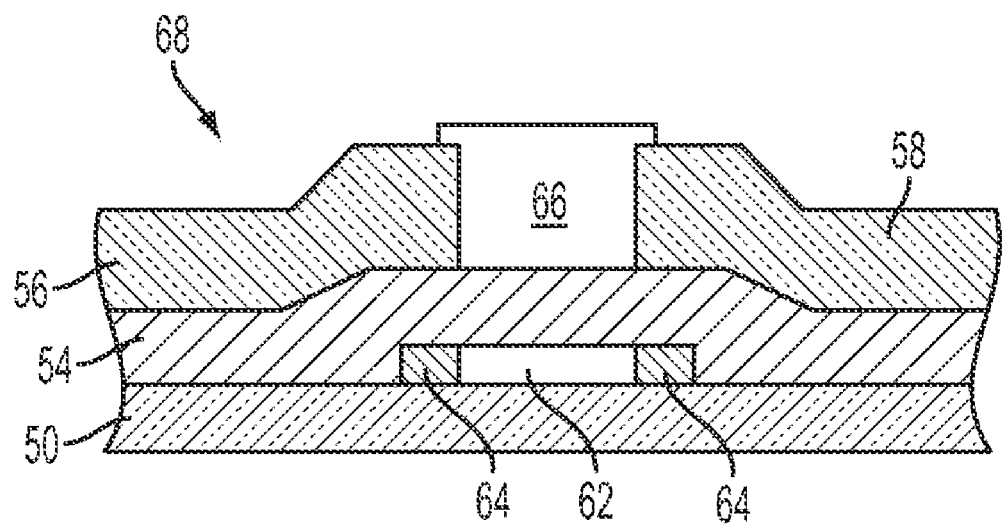

Finally, as shown in FIG. 3E, TFT semiconductor material 66 is formed in the channel between the source-drain region to create the TFT 68.

Figure 4A:
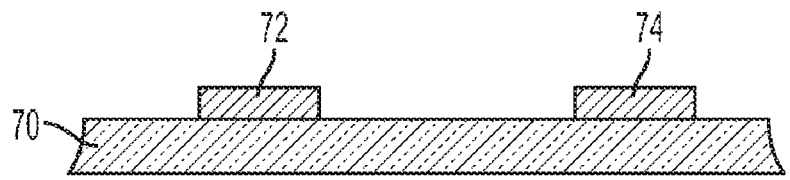
FIGS. 4A-4E illustrate the processing steps for configuring a self-aligning top gate TFT according to the concepts of the present application.

Turning to FIGS. 4A-4D, set forth is an embodiment according to the teachings of the present application, directed to the formation of a self-aligning top gate TFT. Turning initially to FIG. 4A, a substrate 70 has a drain contact 72, and a source contact 74 formed on a surface. In this embodiment, drain contact 72 and source contact 74 may be formed by a number of processing techniques, including printing of the contact. Also, in this embodiment substrate 70 may be formed of a material selected to be transparent at certain wavelengths.

Figure 4B:
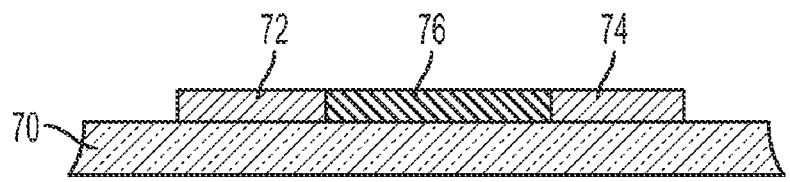

Next, as illustrated in FIG. 4B, a semiconductor material 76 is deposited within a channel between drain contact 72 and source contact 74. In certain embodiments, according to the present teachings, semiconductor material 76 is transparent.

Figure 4C:
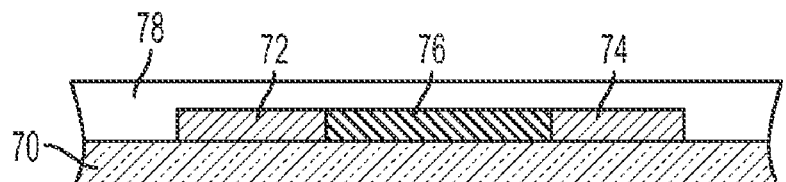

Turning to FIG. 4C, a dielectric material 78 is formed over drain contact 72, source contact 74 and semiconductor material 76. Similar to semiconductor material 76, dielectric contact 78 is also formed, in various embodiments described herein, from a transparent material, e.g., ITO.

Figure 4D:
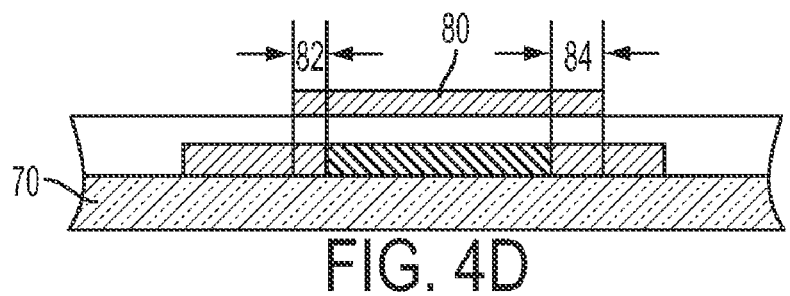

Next, and as shown in FIG. 4D, a state-switchable material 80 is printed or otherwise deposited on an upper surface of dielectric material 78 at a location reasonably associated with the expected placement of the to-be-formed gate contact. As illustrated in FIG. 4D, there exists drain overlap area 82 and source overlap area 84, where portions of drain contact 72 and source contact 74 overlap portions of state-switchable material 80, respectively.

Drain contact 72 and source contact 74 are both opaque, and therefore act as a mask in relation to the state-switchable material 80.

Figure 4E:
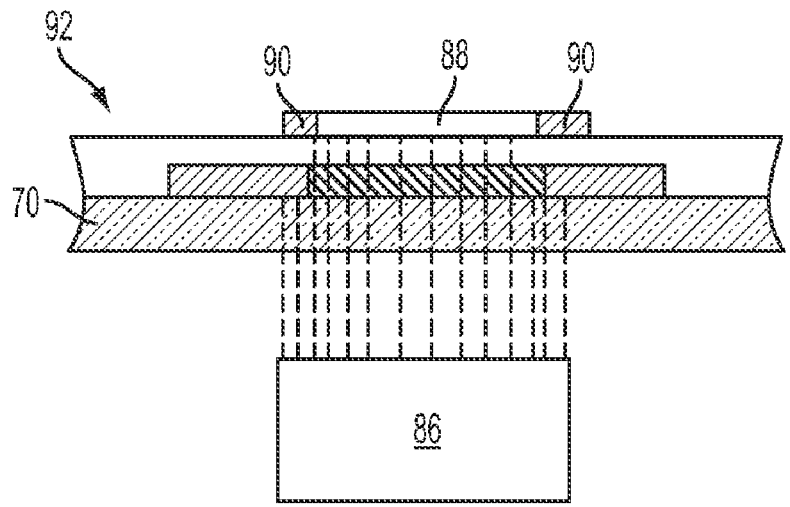

By the implementation of this arrangement, and as shown in FIG. 4E, when an energy source 86 emits energy, this energy passes through transparent substrate 70, as well as transparent semiconductor material 76 and transparent dielectric 78, and impinges upon exposed portions of state-switchable material 80. These exposed portions become conductive 88, while the portions of state switchable material 80 blocked from the beams of energy source 86 by opaque drain contact 72 and source contact 74 remain non-conductive 90. By these operations a top-gate TFT 92 is formed. Of course, it may be desirable in certain uses to cover the upper layer with some sort of protective layer to protect the integrity of TFT 92, including in particular the transformed state-switchable material.

Figure 5:
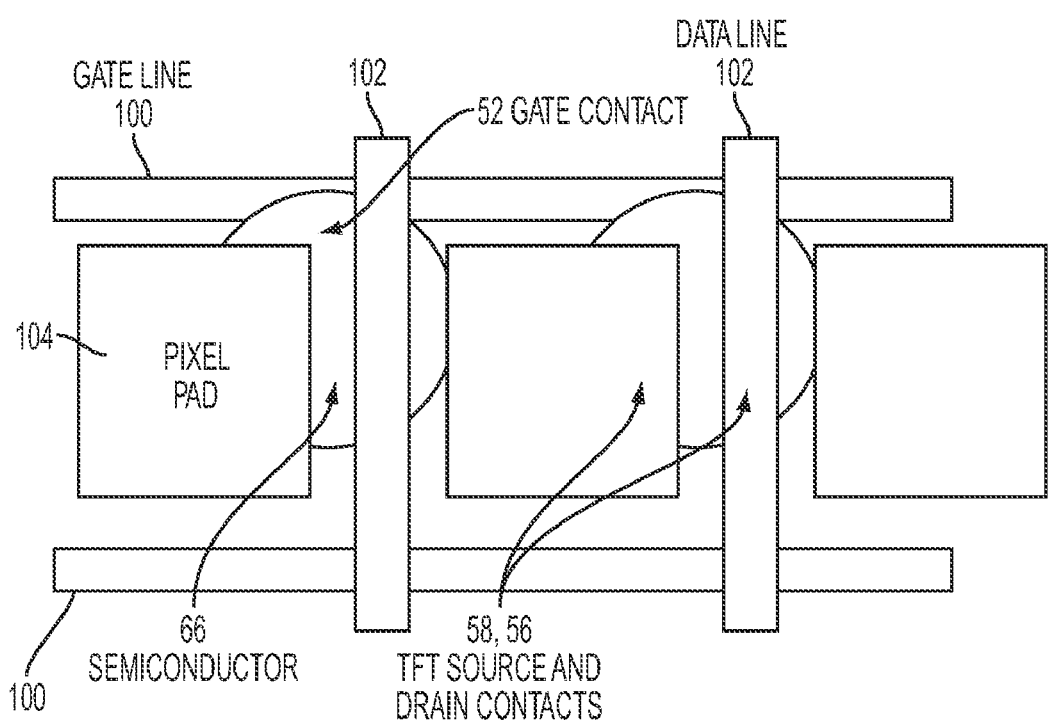
FIG. 5 shows a partial TFT array, including gate lines and data lines connecting the TFTs of the array.

The above-described processes by which bottom gate and top gate self-aligning TFTs are formed, can be extended to multiple TFTs to create a TFT array. For example, with attention to FIG. 5, illustrated is a structure representing printed self-aligned bottom gate TFTs in a typical display backplane. In this embodiment, the TFTs are formed to make the considered bottom gate TFTs, such as described in connection with FIGS. 3A-3E. However, in addition to the processing steps described in connection with those figures processing steps are also provided to form gate address lines 100, for example, by performing additive printing operations, where, for example, a nano-particle metal solution or different metal may be used to form address lines 100 which are in operational contact with the gate contacts. Similarly, to form the array, data address lines 102 are formed during the previously discussed processes along with the TFT source contact and drain contacts, where again the data address line can be formed by additive printing processes through the use of a nano-particle metal or different metal or other appropriate material.

Further, in addition to gate contact 52, drain contact 56 and source contact 58, the proposed structure of FIG. 5 further includes pixel pads 104 in contact with source contact 58. Also shown is semiconductor material layer 66.

Using the described techniques, registration of gate address lines 100, gate contact 52, drain contacts 56 and source contacts 56 may be very relaxed because of the self-aligning process. The only definite requirement for the gate contact material is that it does not form a continuous path from one gate address line 100 to the next, but it can be continuous from one data line 102 to another, because it will only be conducting in the exposed areas and not underneath source or drain the contacts or the data address line.

The described technique removes essentially all of the parasitic capacitance from the drain-source/gate overlap, and so reduces the need for a large pixel capacitance. Hence a TFT array can have a fast refresh rate without requiring a high mobility material, allowing a wider range of material to be useful.

There is still a component of the feedthrough voltage that remains due to the intrinsic capacitance of the TFT channel. This is reduced by making a small channel length, which is generally possible with printing, since it is controlled by drop placement rather than layer-to-layer registration. A reasonably small channel length of perhaps 10-15 microns can be printed with current technology and will allow a high refresh rate with the self-aligned process.

With more particular attention to the gate contact, as discussed, a main requirement of the gate contact material is that it is non-conducting when deposited but can be changed to a conductive state during the self-aligning process. Typical conductivity requirements can be estimated although these will depend on the specific design of the pixel, the geometry of the TFT and the refresh rate requirements. For example, assume a video rate (60 Hz) display with 1000 gate address lines. Each gate line is addressed for 16 micro-sec and so the gate should switch in 5-10 micro-sec. Hence the RC time constant of the conductive state should be substantially smaller than this value and of the insulating state should be much larger. For the purpose of estimation it is assumed that the conducting time constant is 1 micro-sec and the non-conducting time-constant is 100 micro-sec. For a TFT that has a 10-20 micron channel length and a W/L value of 10, the capacitance is about 1 pF. Hence, with these values, the conducting state should have a resistance of about no more than 1 megohm, and the non-conducting state a resistance of at least approximately 100 megohm.

This calculation shows that the change in resistance does not need to be more than a factor 100, and the conducting state can have a relatively low conductance, consistent with a doped semiconductor or a conducting polymer, rather than a metal. For this reason various materials systems are candidates for the material.

A particular type of material which may be used for the gate contact material (i.e., a state-switchable material) is silver halides, which are well known as the basis for photography, with a sensitivity to light that decomposes the material to silver particles, which thus give a conductive film. Some silver halides are soluble and hence can be printed from solution.

Another group of state-switchable materials appropriate for the gate contact material may be certain types of polymers. Particularly light-induced changes in conductivity have been reported in polymers, by illumination that changes the material structure. There is a large body of knowledge on UV curing of polymer material, in which light makes structural changes, which can include conductivity changes. Another benefit of polymers is that they are generally easily printed from solution.

Discussion of such polymers is set forth for example in the articles by E. Kim and Hyo Won Lee, Photo-induced electrical switching through a mainchain polymer, J. Mater. Chem., 2006, 16, 1384-1389, and by X. Guo, D. Zhang, G. Yu, M. Wan, J. Li, Y. Liu, D. Zhu, Reversible Photoregulation of the Electrical Conductivity of Spiropyran-Doped Polyaniline for Information Recording and Nondestructive Processing, Advanced Materials, Volume 16, Issue 7, Pages 636-640).

Still a further potential state-switchable gate contact material is an inorganic semiconductor such as ZnO which is known to be sensitive to illumination and to change its conductivity. ZnO and some other inorganics are soluble and can be printed from solution. Another class of materials are inorganic chalcogenide alloys which are known to be state-switchable by heating to a modest temperature.

In addition to the preceding considerations, it is also worth mentioning that once the conductivity switch has occurred it is desirable that the conductivity does not relax back to a low conductivity state and that the unconverted material under the source and drain metal does not receive exposure during use that would make it conducting. It is therefore preferable if the sensitivity of the state-switchable material is not too high. A high illumination intensity during manufacture is easy to ensure, and if the sensitivity is low, the ambient illumination during use will not convert the material. Sensitivity to the ultraviolet (UV) rather than the visible may also be preferred.

The requirement not to convert material during use also depends on the display type. For a reflective display using, for example an electrophoretic ink, the underside of the display can be coated with an opaque material and should never have significant illumination. However, for use with a liquid crystal display, there is illumination from behind and a transparent pixel pad is needed. In this case UV exposure is preferred as the display can be operated with visible light without the gate contact material converting to its conducting state.

There may be alternative methods to convert the gate contact material. Soft x-rays could be used, and printed silver forms a good mask for this radiation. The change could be performed by ion implantation, although this process may be more expensive to implement. The change may be performed by local heating by IR radiation, in which the source-drain contact reflects the radiation and prevents heating except in the transparent channel.

As previously mentioned, one particular use of the present concepts of self-aligning TFTs is in connection with TFT arrays. The following provides additional discussion of such devices.

Figure 6:
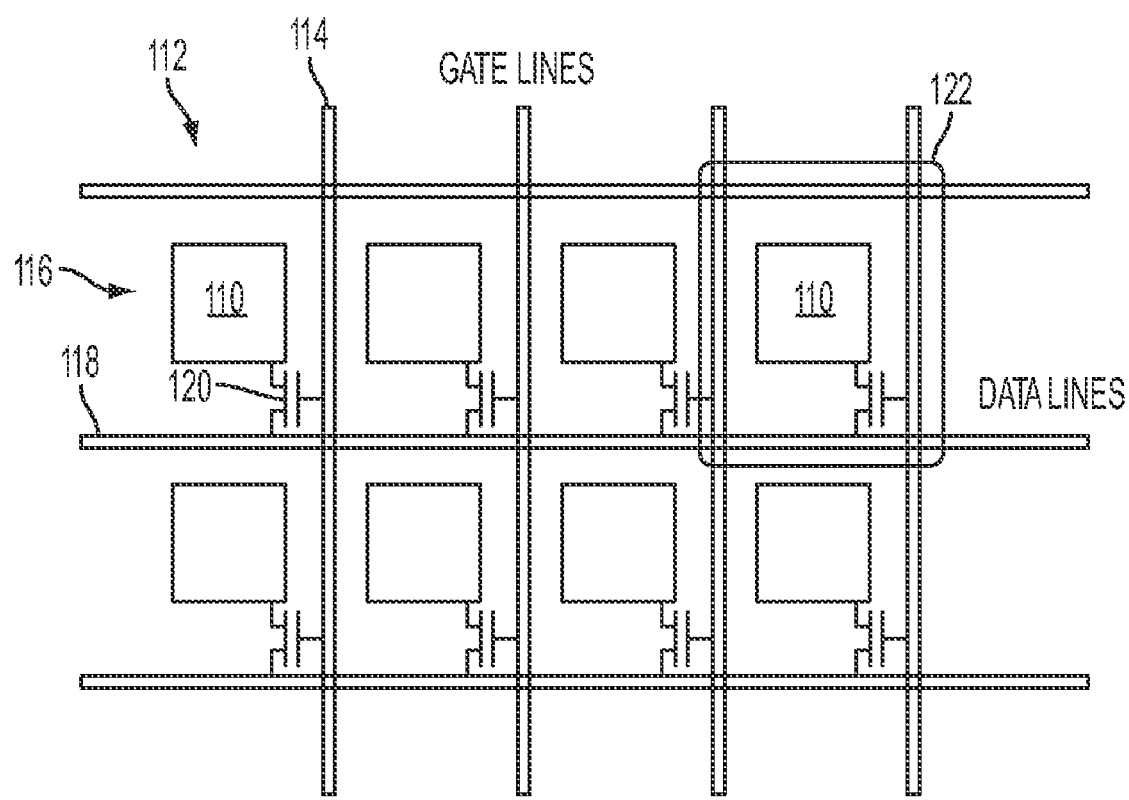
FIG. 6 shows a first embodiment of a TFT array which may be formed in accordance with TFTs of the present application.

Thin film transistor controlled pixel arrays are the basic building blocks in many types of image scanners and large area displays. In conventional array designs, a scan driver controls the gate of TFTs to transfer signals to or from each pixel through the data lines. As illustrated in FIG. 6, pixel sensors 110 are arranged in columns and rows to form an array. Each column of pixel sensors 112 share one gate line 114 and each row of pixel sensors 116 share one data line 118. TFTs 120 are located at the juncture of each gate line 114 and data line 118 such that one of the TFTs 120 is connected to a respective pixel sensor/display element 110, gate line 114 and data line 118. Thus, in conventional designs, a pixel configuration 122 is comprised of a gate line, a data line, a pixel sensor/display element and some margins.

Other arrangements of TFT arrays and different types of TFTs are possible and such arrangements and types can be used in connection with the teachings of this application.

Such arrays may be used in a variety of products such as display backplanes used in a variety of imaging display devices, among other active electronic components.

Finally, the foregoing discussion refers to the manufacture of TFTs by use of additive printing, and turning now to FIGS. 7 and 7A, depicted is a side-view of a TFT being manufactured in accordance with the additive printing processing previously described. More particularly, FIG. 7 illustrates the ongoing printing, by printing device 140, of a semi-conductor material 142 to form a bottom gate TFT 144 with drain contact 146, source contact 148 and gate 150 already in place (i.e., achieved by use of additive printing processes). As in the previous embodiments, gate contact 150 is formed with a state-switchable material. At this point, the portion of the material which is the gate contact 150, has been altered to a conductive state, while the areas 151 under the drain and source contacts 146, 148 remain non-conductive. Slightly different from previous embodiments, and as illustrated by FIG. 7A, this bottom gate TFT includes a self-assembled monolayer layer 152 of a materials such as octadecyltrichlorosilane (OTS) located over dielectric layer 154, which may be added after altering of the state-switchable material. The purpose of the OTS layer is to improve the performance of the semiconductor material 142, particularly when this is an organic semiconductor. The gate 150 and portions of dielectric layer 154 are located on a substrate 156. Address lines, data lines and the pixel contact are not shown in this figure, they would however be formed as discussed in the previous embodiments.

Print head 140 may be part of a jet print head system, piezoelectric print head system, or an acoustic print head system, among others which fulfill additive printing requirements.

The preceding description has focused on the source-drain layer of a display backplane as teaching the concept of different materials being used in the same layer of an active component manufacturing process. However, these concepts may be applied to other layers in the backplane or other active devices, such as, for example, an x-ray imager, an RFID tag, TFT filter, LCD color filters, PLED displays, among others. The techniques will apply when a single layer can be printed at lower cost by separating the layer into two or more portions, when only one of the portions require more expensive material, and where the printing of the layer may be separated into two or more steps.

The preceding description has focused on additive printing of the TFT, because this method of processing has a large problem with parasitic capacitance, and hence the application provides a great improvement, as explained previously. However, an improvement in parasitic capacitance is also gained even when using conventional processing using photolithography, and also when a combination of photolithography and printing are used to fabricate the TFT array. Furthermore, the techniques described here allow fabrication of a high performance display even with the use of photolithography equipment that has reduced alignment accuracy, which has the advantage of lower cost.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A thin film transistor comprising
   a gate contact formed from a state-switchable material;
   a gate dielectric layer formed over the gate contact;
   a source-drain layer including a source contact, and a drain contact formed with a source-drain layer material, wherein any portion of the state-switchable material covered by the source contact and the drain contact is non-conductive and any portion of the state-switchable material not located under the source contact and the drain contact is conductive; and a semiconductor material formed between the source contact and the drain contact.

2. The thin film transistor according to claim 1 wherein the source-drain layer material is opaque.

3. The thin film transistor according to claim 1 wherein the dielectric layer is transparent.

4. The thin film transistor according to claim 1 wherein a source of energy is at least one of light energy or heat energy.

5. The thin film transistor according to claim 1 wherein at least some of the state-switchable material is covered by the drain contact and the source contact, and the drain contact and the source contact are configured to block a source of energy from reaching the portion of the state-switchable material located under the drain contact and the source contact.

6. The thin film transistor according to claim 5 wherein the drain contact and source contact form a mask positioned wherein only portions of the state-switchable material of the gate contact which does not overlap the drain contact and the source contact to be exposed.

7. The thin film transistor according to claim 1 wherein parasitic capacitance is substantially eliminated.

8. The thin film transistor according to claim 1 further including:
a gate address line in operative connection with the gate contact; and
a data address line in operative contact with the drain contact.

9. The thin film transistor according to claim 8 further including a plurality of gate contacts, drain contacts, source contacts, gate address lines, data address lines, and semiconductor layers arranged as an array.

10. A self-aligning thin film transistor comprising:
a gate contact area comprised of a state-switchable material
a gate dielectric configured to isolate the gate contact area;
a source-drain layer, including a source contact and a drain contact configured with a source-drain layer material;
an exposed portion of the gate contact area which has been exposed to a form of energy, wherein the exposed portion of the gate contact area is conductive and the exposed portion of the gate contact area is a gate contact, wherein at least some of the state-switchable material is covered by the drain contact and the source contact, and the drain contact and the source contact are configured to block the energy from reaching the portion of the state-switchable material located under the drain contact and the source contact, and wherein at least a portion of the state-switchable material under the drain contact and the source contact is non-conductive; and
a semi-conductor layer of a semiconductor material is positioned between the source contact and the drain contact.

11. The transistor according to claim 10 wherein the source-drain layer material is opaque.

12. The transistor according to claim 10 wherein the dielectric layer is transparent.

13. The transistor according to claim 10 wherein the energy is at least one of light energy and heat energy.

14. The transistor according to claim 10 wherein the state-switchable material is one of silver halides, a polymer, an inorganic semiconductor, and a chalcogenide alloy.

15. The transistor according to claim 1 wherein the drain contact and source contact act as a mask to allow only portions of the state-switchable material of the gate contact area which does not overlap the drain contact and the source contact to be switched to a conducting state, causing the gate contact, source contact and drain contact to self-align without overlap.

16. The transistor according to claim 10 wherein the form of the transistor is one of a bottom gate TFT or a top gate TFT.

17. A self-aligning thin film transistor comprising:
a gate contact area comprised of a state-switchable material;
a gate dielectric which isolates the gate contact area;
a source-drain layer, including a source contact and a drain contact with a source-drain layer material;
an exposed portion of the gate contact area, wherein the exposed portion of the gate contact area is conductive and the exposed portion of the gate contact area is a gate contact; and
a semi-conductor layer of a semiconductor material between the source contact and the drain contact, wherein the drain contact and the source contact are configured to block the source of energy from reaching the portion of the state-switchable material covered by the drain contact and the source contact, wherein the covered portion of the state-switchable material is non-conductive and the exposed portion of the state-switchable material is conductive.

18. The transistor according to claim 17 wherein the electromagnetic energy is one of visible light, UV light, infra-red light or x-rays.

19. The method according to claim 17 wherein the electromagnetic energy is one of light energy or heat energy.

* * * * *